United States Patent [19]
Brehmer et al.

[11] Patent Number: 5,410,273
[45] Date of Patent: Apr. 25, 1995

[54] LOW DISTORTION OPERATIONAL AMPLIFIER

[75] Inventors: Geoffrey E. Brehmer; Carlin D. Cabler, both of Austin, Tex.

[73] Assignee: Advanced Micro Devices, Sunnyvale, Calif.

[21] Appl. No.: 146,543

[22] Filed: Nov. 1, 1993

[51] Int. Cl.$^6$ .......................... H03F 3/26; H03F 3/45; H03F 1/34
[52] U.S. Cl. .................... 330/253; 330/310; 330/311; 330/300; 330/292
[58] Field of Search ............... 330/310, 311, 292, 300, 330/253

[56] References Cited

U.S. PATENT DOCUMENTS

| | | | |
|---|---|---|---|
| 4,484,148 | 11/1984 | Weiser et al. | 330/311 |
| 4,559,502 | 12/1985 | Huijsing | 330/310 |
| 5,170,134 | 12/1992 | Bien | 330/300 |

Primary Examiner—William L. Sikes
Assistant Examiner—Fetsum Abraham
Attorney, Agent, or Firm—Fulbright & Jaworski

[57] ABSTRACT

An op-amp comprising a single gain stage amplifier cascaded with a buffer and an output stage. The buffer comprises an amplifier which isolates the gain stage from the output stage to prevent loading of the gain stage and create a more linear op-amp. For frequency compensation, the op-amp utilizes MOSFETs connected in a reversed biased configuration as load compensation capacitors. This technique reduces the non-linear effects of MOSFET gate capacitors utilized in conventional Miller compensation schemes and allows for digital fabrication technology of low distortion, low power supply operational amplifier design.

10 Claims, 3 Drawing Sheets

LOW DISTORTION OPERATIONAL AMPLIFIER

BACKGROUND OF THE INVENTION

1. Field of the Invention

The present invention relates to operational amplifiers (op-amps) and, more particularly, to low distortion operational amplifiers operating from a low voltage power supply.

2. Description of the Related Art

Audio chips presently enable personal computers (PCs), compact disk (CD) players, and other portable audio devices to execute high quality audio applications. Typical audio chips comprise digital circuitry which occupies approximately 75–80% of the audio chip's silicon space and analog circuitry which occupies the remaining 20–25%. Typically, the analog circuitry comprises an analog-to-digital (A/D) converter, digital-to-analog (D/A) converter and some output amplifiers. Its main function is to convert an analog input into a digital format suitable for the digital circuitry to process, then convert the digital signals back into an analog format suitable to drive an output device, such as a speaker. The digital circuitry occupies the majority of the silicon area and typically performs digital signal processing, such as filtering, noise shaping, and synthesizing, on the converted analog signals. The main function of these audio chips is to implement an entire audio system on one piece of silicon.

The conventional analog circuitry utilized to implement high quality audio chips comprises an op-amp having: 1) two gain stages; 2) a highly linear Miller compensation capacitor positioned between the two gain stages; and 3) an output stage connected to the output of the second gain stage. The output stage loads (i.e., draws excessive current from) the second gain stage and, therefore, two gain stages are required to achieve acceptable gain from the op-amp. The Miller frequency compensation capacitor must be connected between the two gain stages to ensure that the op-amp receives sufficient frequency compensation to produce a linear output having an acceptable level of harmonic distortion.

Unfortunately, the position of the Miller compensation capacitor between the two gain stages precludes its implementation using a metal-oxide-silicon field-effect transistor (i.e., MOSFET) connected as a capacitor (i.e., a MOSFET gate capacitor). That is, implementing the Miller compensation capacitor with a MOSFET gate capacitor is undesirable because its connection between the gain stages would cause it to forward bias as its gate voltage approached and exceeded the threshold voltage, resulting in the capacitance of the MOSFET gate capacitor becoming highly non-linear. As the capacitance of the MOSFET gate capacitor becomes increasingly non-linear, the op-amp's gain becomes non-linear and, therefore, its output produces a total harmonic distortion between −70 to −75 dB. The level of total harmonic distortion required for CD quality applications is less than −96 dB, thus rendering the Miller MOSFET compensation scheme unacceptable.

Accordingly, a highly linear plate capacitor must implement the Miller compensation capacitor. Either a digital or analog fabrication process may be used to fabricate the plate capacitor, but each has a particular disadvantage. The digital fabrication process (i.e., a single-poly process) could be used to form a thick oxide plate capacitor, but that process requires large amounts of silicon to implement. Because the thick oxide plate capacitor consumes large amounts of the audio chip's silicon, the digital fabrication process is not typically used.

The analog fabrication process may be used to form a thin oxide plate capacitor, but the process requires costly additional steps, including the addition of a second layer of polysilicon with a layer of silicon dioxide interposed to form the thin oxide plate capacitor. Even though this fabrication process is very expensive, it is nevertheless conventionally used because, as previously mentioned, a highly linear compensation capacitor must be connected between the two gain stages.

Thus, considering the limited amount of space on the audio chip for the op-amp, the large silicon requirements of the thick oxide plate capacitor or the additional costly layer requirements of the thin oxide plate capacitor provide an inadequate solution in the implementation of high quality audio chips.

Due to the aforementioned problems associated with presently available audio chips, a demand exists for a low cost, high quality op-amp which may be fabricated entirely using a digital fabrication process that does not significantly impact chip size or the amount of silicon required for fabrication. Furthermore, the op-amp must be capable of operating from a 3.3 volt power supply and provide a very low total harmonic distortion such that its output approximates the output quality of compact disks. To accomplish this, the op-amp must provide adequate amplification of audio signals and, at the same time, generate no more than −96 db total harmonic distortion. Accordingly, amplification must be independent of amplitude and frequency (i.e. highly linear) to preserve the integrity of the input signal. This op-amp represents a significant improvement because it furnishes both a cost and size effective audio amplifier for use in all high quality audio applications, including battery powered or portable communication and computer products.

SUMMARY OF THE INVENTION

In accordance with the present invention, an operational amplifier (op-amp) operates to work with low supply voltages and yet meets the gain and low distortion requirements for high quality PC audio applications. The op-amp is particularly suited for use in battery powered or portable communication products. Furthermore, the op-amp solves many diverse problems found in low power applications in the related art, for example, problems of distortion, stability, and fabrication. The design of this op-amp resolves many of those problems of the prior art due to the op-amp's unique "linearization" buffer and frequency compensation scheme.

This inventive op-amp replaces the conventional dual gain stage op-amp with a single gain stage amplifier cascaded to a buffer and an output stage. The buffer comprises an amplifier which isolates the gain stage from the output stage to prevent loading and creates a more linear op-amp. In addition, the op-amp utilizes MOSFETs connected in a reversed biased configuration to provide frequency compensation. This technique reduces the non-linear effects of conventional MOSFET gate capacitors, eliminates the expense of conventional thin and thick oxide plate capacitors, and enables the op-amp to be fabricated using a cost and size effective digital fabrication process.

DETAILED DESCRIPTION OF THE PREFERRED EMBODIMENT

Figure 1:
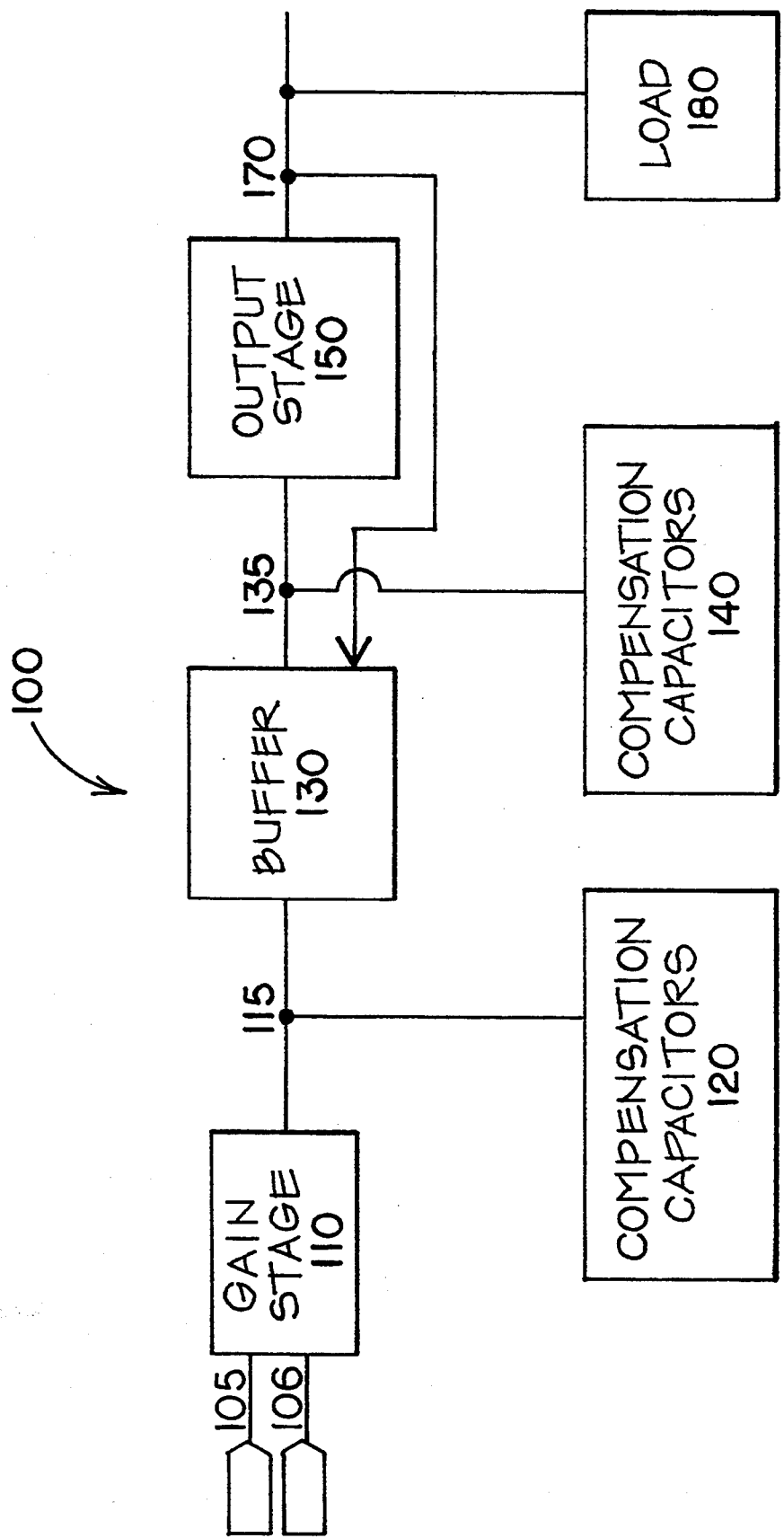
FIG. 1 is a block diagram of the low distortion operational amplifier of the present invention.

FIG. 1 depicts a block diagram of op-amp 100 which comprises a cascade system of gain stage 110, compensation capacitors 120 and 140, buffer 130, and output stage 150. Op-amp 100 receives a differential audio input signal at negative and positive terminals 106 and 105, respectively, and produces an output signal at node 170. Depending on the desired gain, op-amp 100 may be configured in a variety of ways by selecting appropriate component values (not shown). For example, op-amp 100's gain may be varied by positioning a variable feedback resistor between node 170 and terminals 105 or 106.

Gain stage 110 receives the differential audio input signal at terminals 105 and 106 and amplifies the input signal to produce a single-ended output signal at node 115. Buffer 130 receives the output signal from gain stage 110 at node 115 and drives output stage 150 at node 135 with its buffered output signal. Output stage 150 supplies current to load 180 at node 170 in response to the output signal received from buffer 130. Load 180 typically comprises a reactive device which produces capacitive and resistive loading of op-amp 100. Compensation capacitors 120 and 140 connect between nodes 115 and 135, respectively, and a reference potential (e.g. ground) to provide frequency compensation of op-amp 100.

Figure 2:
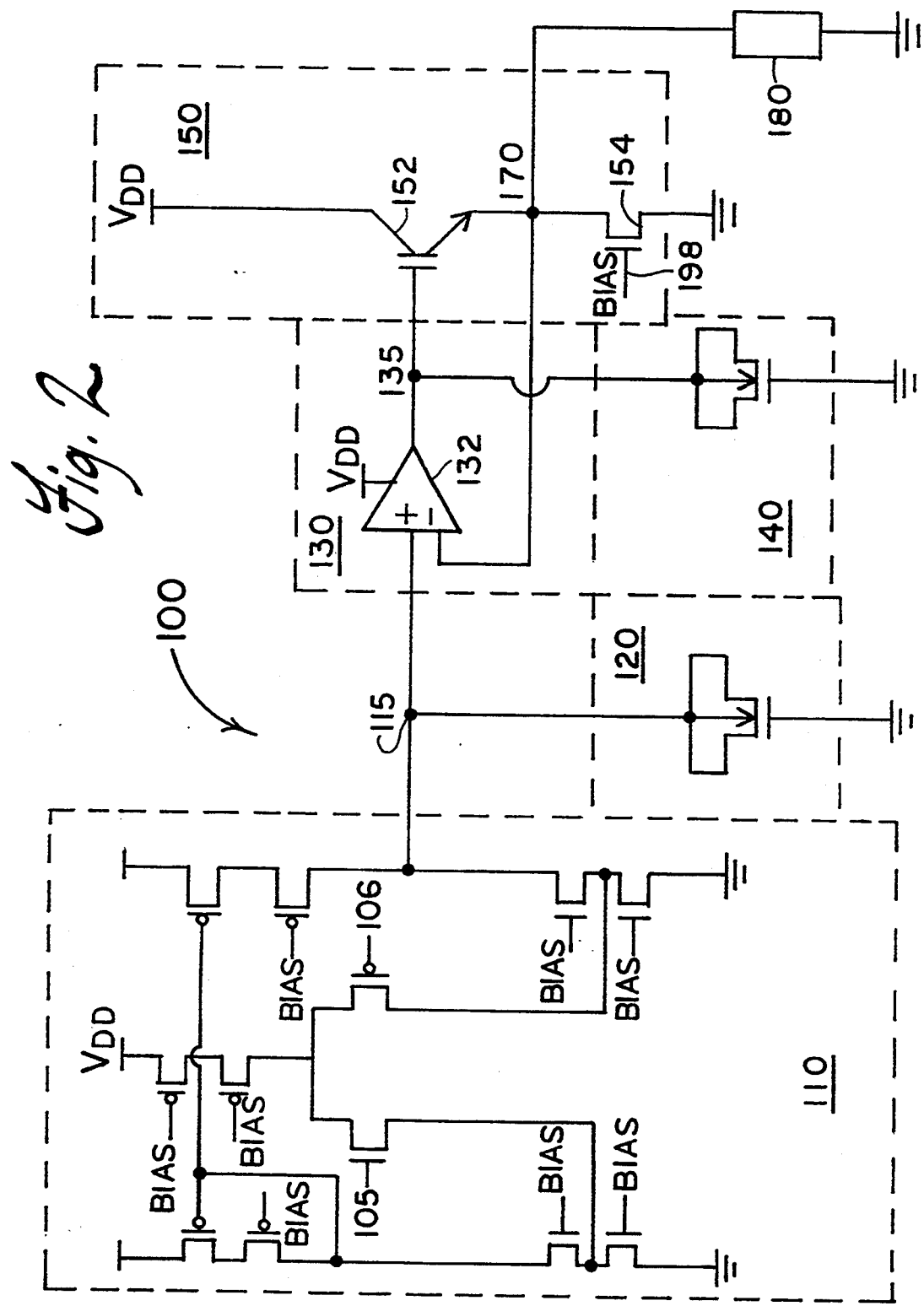
FIG. 2 is a detailed schematic diagram of the low distortion operational amplifier of the present invention.

FIG. 2 depicts a schematic diagram showing the individual components that comprise op-amp 100. In the preferred embodiment, gain stage 110 comprises a single stage folded cascode amplifier. Any suitable single stage amplifier that can be compensated with a capacitor positioned between its output and ground may implement gain stage 110, although the single stage folded cascode amplifier shown in FIG. 2 is particularly advantageous because of its favorable output voltage swing. By using this cascode amplifier, the output of gain stage 110 at node 115 swings nearly rail-to-rail, allowing gain stage 110 to operate from a low voltage supply, such as 3.3 volts. The cascode amplifier of gain stage 110 is the subject matter of copending U.S. patent application Ser. No. 08/085,898, entitled "Operational Amplifier for Low Supply Voltage Applications," filed Jun. 30, 1993 and assigned to the assignee of the present invention.

The cascode amplifier of gain stage 110 is designed to have a minimum voltage drop across P-channel source transistors 121, 124, and 128 and N-channel sink transistors 133 and 136 so that output 115 can swing over a greater range. This cascode amplifier includes both a single stage amplifier section and a network of DC biasing circuitry (see FIG. 3). The single stage amplifier section comprises inverting input 106, non-inverting input 105, P-channel transistors 121, 122, 124, 126, 128, and 131, N-channel transistors 133, 134, 136, and 138, and output 115. When the voltages at inputs 105 and 106 are equal and within the operating range of the cascode amplifier, the current in transistors 121, 122, 133, and 134 (i.e., the output stage) is balanced. When inputs 105 and 106 have a differential voltage across them, the output stage has a current imbalance and either pulls high or low. One significant aspect of this cascode amplifier is the particular implementation of the current mirror formed by transistors 121, 122, 128, and 131. Through these particular aspects, the cascode amplifier's transistors remain in saturation and the cascodeal load improves power supply rejection and open-loop gain.

Figure 3:
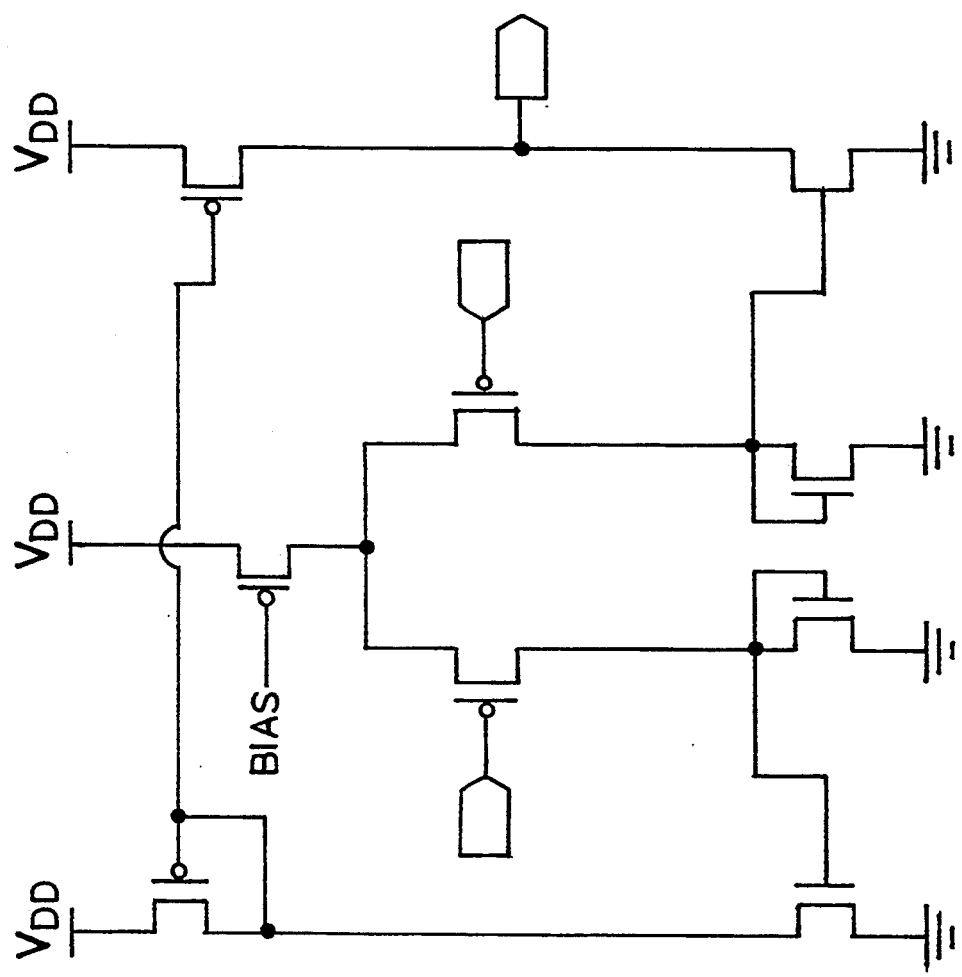
FIG. 3 is a schematic diagram of a DC biasing circuit for use with the op-amp of FIG. 2.

The bias circuit shown in FIG. 3 furnishes DC biasing to the bias terminals of the cascode amplifier and, furthermore, is also the subject matter of copending U.S. patent application Ser. No. 08/085,898. The bias circuit of the cascode amplifier comprises P-channel transistors 171, 172, 174, and 176 and N-channel transistors 151, 153, 155, 156, 158, 161, 162, and 164. Inputs to the bias circuit comprise dual biasing circuitry inputs 196 and 198. The bias circuit establishes bias voltages on current sink transistors 133 and 136 and cascode transistors 122, 126, 131, 134, and 138. In this manner, the current mirroring between transistors 128 and 121 and between current sink transistors 133 and 136 cause those transistors to remain in the saturation region for all values of output swing.

Referring to FIG. 2, terminals 105 and 106 are supplied by an audio differential input signal. Gain stage 110 amplifies the differential input signal and produces a single ended output signal at node 115. Gain stage 110 is unsuited for directly driving output stage 150 because output stage 150 and load 180 would draw excessive current from gain stage 110. The combined loading of output stage 150 and load 180 would force the gain MOSFETs in gain stage 110 to operate in their more non-linear regions, resulting in reduced gain and distortion of the output signal from gain stage 110.

Accordingly, buffer 130 connects to the output of gain stage 110 at node 115 and the input of output stage 150 at node 135 to effectively isolate gain stage 110 from output stage 150 and load 180. In the preferred embodiment, buffer 130 comprises amplifier 132, which may be implemented using the single stage folded cascode amplifier utilized for gain stage 110. However, amplifier 132 may be implemented using any suitable buffer device, such as a single stage push-pull amplifier capable of swinging nearly rail-to-rail.

Amplifier 132 has a large input impedance, while gain stage 110 has a large output impedance. Therefore, the output of gain stage 110 couples to a corresponding large input impedance at node 115 to virtually eliminate any nonlinearity, thereby maintaining a consistently high gain in gain stage 110. Consequently, gain stage 110 can be implemented with a single gain stage amplifier, as opposed to a dual gain stage amplifier, and continues to provide adequate gain. Thus, gain stage 110 amplifies the differential audio input signals applied at terminals 105 and 106 to produce an undistorted, linearized output signal having a maximum gain, which it delivers to amplifier 132.

Amplifier 132 is configured as a voltage follower and is biased using a 3.3 volt power supply $V_{DD}$. Amplifier 132 receives the output signal from gain stage 110 at its non-inverting input (node 115) and buffers the signal to produce an output signal at node 135. Amplifier 132 receives direct feedback from node 170 to its inverting input to stabilize and linearize the output of amplifier 132. As a result, the voltage at node 170 follows the voltage at node 115. To keep the voltages at nodes 170 and 115 virtually equivalent, amplifier 132 provides additional amplification to compensate for the threshold voltage drop across the base and emitter of emitter follower 152. Thus, amplifier 132 transfers the output signal from gain stage 110 to output stage 150 with minimum distortion to ensure a linearized output from output stage 150.

Output stage 150 is a Class A shunt feedback follower configuration comprising emitter follower 152 and current sink 154. Emitter follower 152 comprises an NPN bipolar junction transistor having its collector connected to 3.3 volt power supply $V_{DD}$, its base connected to the output of amplifier 132 and its emitter connect to output node 170. Current sink 154 comprises an enhancement-type N-channel MOSFET having its drain connected to output node 170 and its source connected to the reference potential. A bias circuit, such as the bias circuit disclosed in U.S. patent application Ser. No. 08/085.898, biases the gate of current sink 154 at bias point 198 using classical current mirroring techniques to drive current sink 154 into its saturation region. As a result, current sink 154 operates as a constant current sink to ensure that changes in the audio input signal will be reflected solely at output node 170 and, thus, load 180.

Specifically, as the output from amplifier 132 into the base of emitter follower 152 changes in response to a changing audio input signal, current sink 154 draws constant current unless the voltage at node 135 drops so low that emitter follower 152 turns off. Because current sink 154 operates independently of emitter follower 152 to draw constant current, load 180 never experiences any increase or decrease in current from the emitter of emitter follower 152. Although output stage 150 has been implemented utilizing an emitter follower, any suitable output stage could be substituted, such as a source follower.

Compensation capacitors 120 and 140 each comprise an N-channel MOSFET connected in a reversed biased configuration. Because compensation capacitors 120 and 140 are MOSFETs, they are fabricated using the standard digital fabrication process and use a minimum of silicon space. Therefore, op-amp 100 can be fabricated in its entirety using the standard digital fabrication process. In the preferred embodiment, gain stage 110 and buffer 130 are single stage cascode amplifiers and, therefore, each have one dominant pole at its respective output. As a result, compensation capacitors 120 and 140 connect between nodes 115 and 135, respectively, and ground to provide frequency compensation.

Specifically, compensation capacitor 120 has a gate connected to ground and a source, drain, and bulk connected to node 115, while compensation capacitor 140 has a gate connected to ground and a source, drain, and bulk connected to node 135. Because compensation capacitors 120 and 140 have grounded gates, they are always turned OFF, thereby eliminating the non-linear effects of conventional MOSFET gate capacitors. As the output frequency increases, the impedance of compensation capacitors 120 and 140 decreases, thereby decreasing the gain of gain stage 110 and buffer 130 at higher frequencies. This technique places the dominant poles well below unity gain bandwidth, prevents oscillation, and creates a stable, linear output.

The present invention overcomes the limitations in the related art and is particularly effective when configured and employed as described herein, however, those skilled in the art will readily recognize that numerous variations and substitutions may be made to the invention to achieve substantially the same results as achieved by the preferred embodiment. Therefore, the detailed description is to be clearly understood as being given by way of illustration and example only, the spirit and scope of the present invention to be limited solely by the following claims:

We claim:

1. A low distortion operational amplifier comprising:
   a gain stage having an input and an output;
   an output stage having an input and an output for driving a load;
   a buffer for isolating said gain stage from and said output stage, said buffer having an input connected to said output of said gain stage and an output connected to said input of said output stage; and
   a first frequency compensation capacitor connected between said output of said gain stage and a reference potential wherein said first frequency compensation capacitor comprises a MOSFET.

2. The low distortion operational amplifier according to claim 1 wherein said first frequency compensation capacitor further comprises said MOSFET having a gate connected to said reference potential and a drain, source, and bulk connected to said output of said gain stage to reverse bias said MOSFET.

3. The low distortion operational amplifier according to claim 1 further comprising a second frequency compensation capacitor connected between said output of said of said buffer and said reference potential, wherein said second frequency compensation capacitor comprises a MOSFET.

4. The low distortion operational amplifier according to claim 3 wherein said second frequency compensation capacitor further comprises said MOSFET having a gate connected to said reference potential and a drain source, and bulk connected to said output of said buffer to reverse bias said MOSFET.

5. The low distortion operational amplifier according to claim 1 wherein said buffer comprises an amplifier having a non-inverting input connected to said output of said gain stage and an inverting input connected to said output of said output stage.

6. The low distortion operational amplifier according to claim 5 wherein said amplifier comprises a folded cascode amplifier.

7. The low distortion operational amplifier according to claim 1 wherein said output stage comprises a voltage follower connected to a current sink.

8. The low distortion operational amplifier according to claim 7 wherein said voltage follower comprises an emitter follower having a collector connected to a power supply, a base connected to said output of said buffer, and an emitter connected to said output of said output stage.

9. The low distortion operational amplifier according to claim 7 wherein said constant current sink comprises a MOSFET having a drain connected to said output of said output stage, a gate biased in the saturation region, and a source connected to a reference potential.

10. The low distortion operational amplifier according to claim 1 wherein said gain stage, said buffer and said output stage are biased at no greater than about 3.3 volts DC.

* * * * *